(12) United States Patent
Li et al.

(10) Patent No.: US 12,062,725 B2
(45) Date of Patent: Aug. 13, 2024

(54) THIN FILM TRANSISTOR, DISPLAY PANEL AND DISPLAY DEVICE

(71) Applicant: BOE TECHNOLOGY GROUP CO., LTD., Beijing (CN)

(72) Inventors: Dong Li, Beijing (CN); Shantao Chen, Beijing (CN); Huijuan Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/637,479

(22) PCT Filed: Feb. 26, 2021

(86) PCT No.: PCT/CN2021/078198
§ 371 (c)(1),
(2) Date: Feb. 23, 2022

(87) PCT Pub. No.: WO2022/178842
PCT Pub. Date: Sep. 1, 2022

(65) Prior Publication Data
US 2024/0120422 A1   Apr. 11, 2024

(51) Int. Cl.
*H01L 27/14* (2006.01)
*H01L 27/12* (2006.01)
(Continued)

(52) U.S. Cl.
CPC ...... *H01L 29/78696* (2013.01); *H01L 27/124* (2013.01); *H01L 27/1255* (2013.01); *H01L 29/4908* (2013.01); *H01L 29/78645* (2013.01)

(58) Field of Classification Search
CPC ............. H01L 29/78696; H01L 27/124; H01L 27/1255; H01L 29/4908; H01L 29/78645; H01L 29/786; H01L 29/788
(Continued)

(56) References Cited

U.S. PATENT DOCUMENTS 6,781,155 B1   8/2004 Yamada
8,975,630 B2   3/2015 Yoon et al.
(Continued)

FOREIGN PATENT DOCUMENTS

CN   1452250 A    10/2003
CN   102194890 A   9/2011
(Continued)

OTHER PUBLICATIONS

Written Opinion from PCT/CN2021/078198 dated Dec. 8, 2021.

*Primary Examiner* — Tan N Tran
(74) *Attorney, Agent, or Firm* — Calfee, Halter & Griswold LLP

(57) ABSTRACT

The present disclosure provides a thin film transistor, a display panel and a display device. The thin film transistor includes a semiconductor material layer, a first insulating layer and a gate layer. The semiconductor material layer is at a side of a base substrate, and includes a first channel portion, a first doped portion and a second channel portion sequentially connected. The first insulating layer is at a side of the semiconductor material layer facing away from the base substrate. The gate layer is at a side of the first insulating layer facing away from the semiconductor material layer, and includes a first gate portion and a second gate portion. An orthographic projection of the first gate portion on the base substrate coincides with an orthographic projection of the first channel portion on the base substrate, and the first gate portion is configured to receive a gate driving signal.

18 Claims, 11 Drawing Sheets

(51) Int. Cl.
*H01L 29/49* (2006.01)
*H01L 29/786* (2006.01)
(58) Field of Classification Search
USPC .................................................. 257/59, 72
See application file for complete search history.

(56) References Cited

U.S. PATENT DOCUMENTS

| | | |
|---|---|---|
| 9,941,312 B2 | 4/2018 | Li |
| 10,211,270 B2 | 2/2019 | Ha |
| 2011/0113200 A1 | 5/2011 | Moses et al. |
| 2015/0008395 A1 | 1/2015 | Yoon et al. |
| 2016/0260790 A1 | 9/2016 | Lee et al. |
| 2017/0040407 A1* | 2/2017 | Shin ............... H10K 59/131 |
| 2018/0033808 A1 | 2/2018 | Li |
| 2018/0151650 A1 | 5/2018 | Ha |

FOREIGN PATENT DOCUMENTS

| | | |
|---|---|---|
| CN | 105390451 A | 3/2016 |
| CN | 107275408 A | 10/2017 |
| CN | 108122930 A | 6/2018 |
| JP | H05289103 A | 11/1993 |
| JP | 2000214800 A | 8/2000 |
| KR | 100575544 B1 | 4/2006 |

* cited by examiner

THIN FILM TRANSISTOR, DISPLAY PANEL AND DISPLAY DEVICE

This application is the 371 application of PCT Application No. PCT/CN2021/078198, filed Feb. 26, 2021, the contents of which are incorporated herein by reference in its entirety.

TECHNICAL FIELD

The present disclosure relates to the technical field of display, in particular to a thin film transistor, a display panel and a display device.

BACKGROUND

Thin film transistors are usually used as switching devices in various electrical appliances. However, it is easy to generate leakage current when the thin film transistors are turned off, thus affecting the normal operation of electrical appliances.

It should be noted that information disclosed in this part are provided only for acquiring a better understanding of the background of the present application and therefore may include information that is not current technology already known to those of ordinary skill in the art.

SUMMARY

According to an aspect of the present disclosure, a thin film transistor is provided. The thin film transistor includes a semiconductor material layer, a first insulating layer, and a gate layer. The semiconductor material layer is located at a side of a base substrate, and the semiconductor material layer includes a first channel portion, a first doped portion and a second channel portion which are sequentially connected. The first insulating layer is located at a side of the semiconductor material layer facing away from the base substrate. The gate layer is located at a side of the first insulating layer facing away from the base substrate, and includes a first gate portion and a second gate portion. An orthographic projection of the first gate portion on the base substrate covers an orthographic projection of the first channel portion on the base substrate, and the first gate portion is configured to receive a gate driving signal. An orthographic projection of the second gate portion on the base substrate covers an orthographic projection of the second channel portion on the base substrate, and the second gate portion is suspended.

In an exemplary embodiment of the present disclosure, the orthographic projection of the first channel portion on the base substrate is rectangular, an orthographic projection of the first doped portion on the base substrate is rectangular, and the orthographic projection of the second channel portion on the base substrate is rectangular. The orthographic projection of the first channel portion on the base substrate, the orthographic projection of the first doped portion on the base substrate and the orthographic projection of the second channel portion on the base substrate are sequentially distributed in a first direction. The orthographic projection of the first channel portion on the base substrate, the orthographic projection of the first doped portion on the base substrate and the orthographic projection of the second channel portion on the base substrate are combined to form a rectangle.

In an exemplary embodiment of the present disclosure, a size of the orthographic projection of the first channel portion in the first direction is S1, a size of the orthographic projection of the second channel portion in the first direction is S2, and a value of S1/S2 is 3-15.

In an exemplary embodiment of the present disclosure, a size of the orthographic projection of the first doped portion on the base substrate in the first direction is L, and the value of S1/L is 3-15.

In an exemplary embodiment of the present disclosure, S1 is equal to 2.8-3.2 microns, S2 is equal to 0.2-0.8 microns, and L is equal to 0.2-0.8 microns.

In an exemplary embodiment of the present disclosure, the semiconductor material layer is made of a polysilicon semiconductor.

In an exemplary embodiment of the present disclosure, the semiconductor material layer further includes a second doped portion and a third doped portion. The second doped portion is connected to the first channel portion. The third doped portion is connected to the second channel portion. The thin film transistor further includes a second insulating layer and a source/drain layer. The second insulating layer is located at a side of the gate layer facing away from the base substrate. A first via hole penetrating through the first insulating layer and the second insulating layer and a second via hole penetrating through the first insulating layer and the second insulating layer are formed on the first insulating layer and the second insulating layer. An orthographic projection of the first via hole on the base substrate is on an orthographic projection of the second doped portion on the base substrate, and an orthographic projection of the second via hole on the base substrate is on an orthographic projection of the third doped portion on the base substrate. The source/drain layer is located at a side of the second insulating layer facing away from the base substrate. The source/drain layer includes a first conductive portion and a second conductive portion. The first conductive portion is connected to the second doped portion through the first via hole for forming a first electrode of the thin film transistor. The second conductive portion is connected to the third doped portion through the second via hole for forming a second electrode of the thin film transistor.

In an exemplary embodiment of the present disclosure, the semiconductor material layer further includes a fourth doped portion and a third channel portion. The fourth doped portion is connected between the first channel portion and the second doped portion. The third channel portion is connected between the second doped portion and the fourth doped portion. The gate layer further includes a third gate portion, an orthographic projection of the third gate portion on the base substrate covers an orthographic projection of the third channel portion on the base substrate, and the third gate portion is connected with the first gate portion.

In an exemplary embodiment of the present disclosure, the semiconductor material layer further includes a fourth doped portion and a third channel portion. The fourth doped portion is connected between the second channel portion and the third doped portion. The third channel portion is connected between the third doped portion and the fourth doped portion. The thin film transistor further includes a third gate portion, an orthographic projection of the third gate portion on the base substrate covers an orthographic projection of the third channel portion on the base substrate, and the third gate portion is connected with the first gate portion.

In an exemplary embodiment of the present disclosure, a display panel is provided. The display panel includes at least one thin film transistor as described above.

In an exemplary embodiment of the present disclosure, the at least one thin film transistor includes a first transistor, the display panel includes a pixel driving circuit including a driving transistor and the first transistor, a first electrode of the first transistor is connected with a gate of the driving transistor, and the first transistor forms the thin film transistor.

In an exemplary embodiment of the present disclosure, a second electrode of the first transistor is connected to an initial signal terminal, the at least one thin film transistor further includes a second transistor, the pixel driving circuit further includes a second transistor, a second electrode of the second transistor is connected to a gate of the driving transistor, and the first electrode is connected to a first electrode of the driving transistor.

In an exemplary embodiment of the present disclosure, the display panel includes a base substrate, an active layer, a first conductive layer, and a second conductive layer. The active layer is located at a side of the base substrate. The active layer includes a first active portion and a second active portion. The first active portion is configured to form a first channel portion of the first transistor. The second active portion is configured to form a second channel portion of the first transistor, an orthographic projection of the first active portion on the base substrate and an orthographic projection of the second active portion on the base substrate is distributed in a fourth direction. The first conductive layer is located at a side of the active layer facing away from the base substrate. The first conductive layer includes a first gate line and a third conductive portion. An orthographic projection of the first gate line on the base substrate extends in a third direction, and covers an orthographic projection of the first active portion on the base substrate, a part of the first gate line is configured to form a first gate of the first transistor, and the third direction intersects with the fourth direction. An orthographic projection of the third conductive portion on the base substrate covers the orthographic projection of the second active portion on the base substrate for forming a second gate of the first transistor. The second conductive layer is located at a side of the first conductive layer facing away from the base substrate. The second conductive layer includes a second gate line for providing the initial signal terminal. An orthographic projection of the third conductive portion on the base substrate is located at a side of the orthographic projection of the first gate line on the base substrate away from an orthographic projection of the second gate line on the base substrate.

In an exemplary embodiment of the present disclosure, the first transistor is the thin film transistor according to claim 8. The active layer further includes a third active portion and a fourth active portion. The third active portion is configured to form a third channel portion of the first transistor. The fourth active portion is configured to form a fourth doped portion of the first transistor, an orthographic projection of the fourth active portion on the base substrate is located at a side of the orthographic projection of the first gate line on the base substrate away from the orthographic projection of the third conductive portion on the base substrate. The orthographic projection of the first gate line on the base substrate also covers the orthographic projection of the third active portion on the base substrate, and a part of the first gate line is configured to form a third gate of the first transistor. A second electrode of the driving transistor is connected with a first power terminal, and the display panel further includes a third conductive layer at a side of the second conductive layer facing away from the base substrate. The third conductive layer includes a power line for providing the first power terminal, an orthographic projection of the power line on the base substrate extends in the fourth direction, and the orthographic projection of the first active portion on the base substrate is located at a side of the orthographic projection of the third active portion on the base substrate away from the orthographic projection of the power line on the base substrate.

In an exemplary embodiment of the present disclosure, the orthographic projection of the second gate line on the base substrate at least partially coincides with the orthographic projection of the fourth active portion on the base substrate.

In an exemplary embodiment of the present disclosure, the pixel driving circuit further includes a capacitor, a first electrode of the capacitor is connected to the gate of the driving transistor, and a second electrode of the capacitor is connected to the first power terminal. The active layer further includes a fifth active portion and a sixth active portion. The fifth active portion is configured to form a first channel portion of the second transistor. The sixth active portion is configured to form a second channel portion of the second transistor. The first conductive layer includes a third gate line, a fourth conductive portion and a fifth conductive portion. An orthographic projection of the third gate line on the base substrate extends in the third direction, and covers an orthographic projection of the fifth active portion on the base substrate, and a part of the third gate line is configured to form a first gate of the second transistor. An orthographic projection of the fourth conductive portion on the base substrate covers an orthographic projection of the sixth active portion on the base substrate for forming a second gate of the second transistor. The fifth conductive portion is configured to form the gate of the driving transistor and a first electrode of the capacitor. The second conductive layer further includes a sixth conductive portion, an orthographic projection of the sixth conductive portion on the base substrate at least partially overlaps with an orthographic projection of the fifth conductive portion on the base substrate for form a second electrode of the capacitor, and the orthographic projection of the sixth conductive portion on the base substrate is located at a side of the orthographic projection of the third gate line on the base substrate away from the orthographic projection of the first gate line on the base substrate. The orthographic projection of the fourth conductive portion on the base substrate is located between the orthographic projection of the third gate line on the base substrate and the orthographic projection of the first gate line on the base substrate.

In an exemplary embodiment of the present disclosure, the third direction is a row direction, the display panel further includes a first pixel driving circuit and a second pixel driving circuit which are adjacently arranged in the row direction, and the second conductive layer further includes a first connecting portion connected to the same power line as a driving transistor in the first pixel driving circuit. An orthographic projection of the first connecting portion on the base substrate at least partially coincides with an orthographic projection of the first gate of the second transistor in the second pixel driving circuit on the base substrate.

In an exemplary embodiment of the present disclosure, the first gate line, the third gate line, the third conductive portion and the fourth conductive portion are formed on the same layer by optical proximity correction mask technology.

In an exemplary embodiment of the present disclosure, a display device is provided. The display device includes the display panel as described above.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate embodiments consistent with the invention and, together with the description, serve to explain the principles of the invention. Apparently, the drawings in the following description are only for illustrating some embodiments of the present disclosure and those of ordinary skill in the art can also derive other drawings based on the drawings without paying any creative labor.

DETAILED DESCRIPTION

Figure 1:
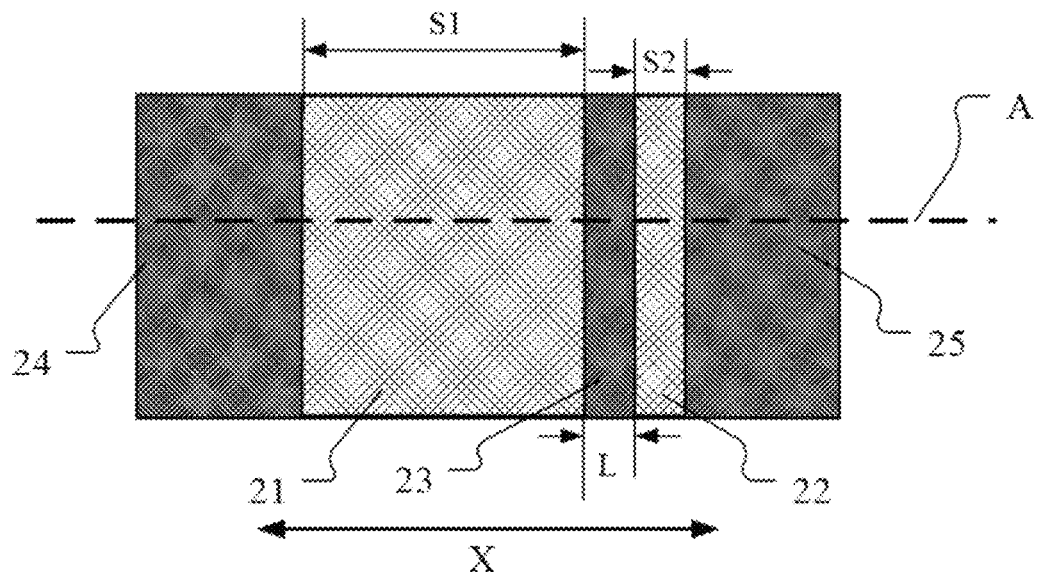
FIG. 1 is a top view of a thin film transistor according to an exemplary embodiment of the present disclosure.

Exemplary embodiments will now be described more fully by reference to the accompanying drawings. However, the exemplary embodiments may be implemented in various forms and should not be understood as being limited to the examples set forth herein; rather, the embodiments are provided so that this disclosure will be thorough and complete, and the conception of exemplary embodiments will be fully conveyed to those skilled in the art. The same reference signs in the drawings denote the same or similar structures and detailed description thereof will be omitted.

Although terms having opposite meanings such as "up" and "down" are used herein to describe the relationship of one component relative to another component, such terms are used herein only for the sake of convenience, for example, "in the direction illustrated in the figure". It may be understood that if a device denoted in the drawings is turned upside down, a component described as "above" something will become a component described as "under" something. When a structure is described as "above" another structure, it probably means that the structure is integrally formed on another structure, or, the structure is "directly" disposed on another structure, or, the structure is "indirectly" disposed on another structure through an additional structure.

Words such as "one", "an/a", "the" and "said" are used herein to indicate the presence of one or more elements/component parts/and others. Terms "including", and "having" have an inclusive meaning which means that there may be additional elements/component parts/and others in addition to the listed elements/component parts/and others.

Figure 2:
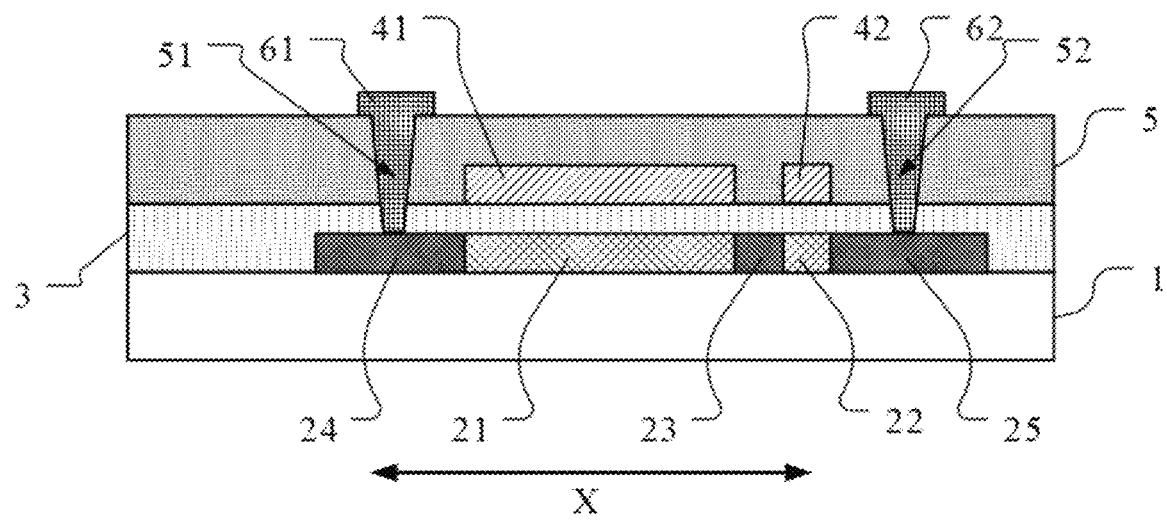
FIG. 2 is a cross-sectional view at a position of a dashed line A in FIG. 1.

In this exemplary embodiment, a thin film transistor is provided, as shown in FIGS. 1 and 2. FIG. 1 is a top view of a thin film transistor according to an exemplary embodiment of the present disclosure, and FIG. 2 is a cross-sectional view at a position of a dashed line A in FIG. 1. FIG. 1 only shows a structural layout of a semiconductor material layer in a thin film transistor. The thin film transistor may include a semiconductor material layer, a first insulating layer 3, and a gate layer. The semiconductor material layer is located at a side of a base substrate 1, and the semiconductor material layer may include a first channel portion 21, a first doped portion 23 and a second channel portion 22 which are sequentially connected. The first insulating layer 3 may be located at a side of the semiconductor material layer facing away from the base substrate 1. The gate layer is located at a side of the first insulating layer 3 facing away from the base substrate 1. The gate layer may include a first gate portion 41 and a second gate portion 42. An orthographic projection of the first gate portion 41 on the base substrate 1 may cover an orthographic projection of the first channel portion 21 on the base substrate 1, and the first gate portion 41 is configured to receive a gate driving signal. An orthographic projection of the second gate portion 42 on the base substrate 1 may cover an orthographic projection of the second channel portion 22 on the base substrate 1, and the second gate portion is suspended. That the second gate portion is suspended may be understood as that when the thin film transistor is independently placed or operated, the second gate portion is not electrically connected with any conductive structure.

When the thin film transistor is operated, only the first gate portion 41 is connected to a control signal terminal, and the second gate portion 42 is not connected to any signal terminal. When the thin film transistor needs to be turned on, the first gate portion 41 receives a turn-on signal, and the first channel portion 21 and the second channel portion 22 may generate a conductive channel under an electric field of the first gate portion 41. In addition, a voltage of the second gate portion 42 may change under the coupling effect of the first gate portion 41, so that the second channel portion 22 may further enhance the conductivity of its conductive channel under an electric field of the second gate portion 42. When the thin film transistor needs to be turned off, the leakage current of the thin film transistor is small under the dual action of the first channel portion 21 and the second channel portion 22. In addition, when the thin film transistor is turned off, the second gate portion 42 will affect the electric field between the source and drain of the thin film transistor, which includes an affect that the second gate portion 42 induces an internal electric field in the source and drain electric field opposite to the source and drain electric field, that is, the second gate portion 42 reduces the electric field between the source and the drain of the thin film transistor, thereby reducing the leakage current between the source and the drain.

In this exemplary embodiment, an orthographic projection of the second gate portion on the base substrate may coincide with the orthographic projection of the second channel portion on the base substrate; and an orthographic projection of the first gate portion on the base substrate may coincide with the orthographic projection of the first channel portion on the base substrate.

In this exemplary embodiment, the thin film transistor may be either an N-type transistor or a P-type transistor. For example, the thin film transistor may be a P-type transistor in this exemplary embodiment. The semiconductor material layer may be made of a polysilicon semiconductor. The first doped portion 23 may be a polysilicon conductor formed by doping ions with the polysilicon semiconductor, and the first channel portion 21 and the second channel portion 22 may be undoped polysilicon semiconductors. In addition, the doped portions mentioned below may be polysilicon conductors formed by doping ions with polysilicon semiconductors, and the channel portions may be undoped polysilicon semiconductors. The thin film transistor may be a low temperature polysilicon transistor. In related technologies, the low-temperature polysilicon transistor has high carrier mobility and reaction speed, however, a technical difficulty of the low-temperature poly silicon transistor is its large turn-off leakage current. The thin film transistor provided by the present disclosure may be a low-temperature polysilicon transistor, which may overcome the technical difficulty of large leakage current. It should be understood that in other exemplary embodiments, the semiconductor material layer may also be formed of another material, for example, the semiconductor material layer may be formed of a metal oxide semiconductor, or for example, the semiconductor material layer may be formed of indium gallium zinc oxide.

In this exemplary embodiment, as shown in FIGS. 1 and 2, the orthographic projection of the first channel portion 21 on the base substrate 1 may be rectangular, an orthographic projection of the first doped portion 23 on the base substrate 1 may be rectangular, and the orthographic projection of the second channel portion 22 on the base substrate 1 may be rectangular. The orthographic projection of the first channel portion 21 on the base substrate 1, the orthographic projection of the first doped portion 23 on the base substrate 1 and the orthographic projection of the second channel portion 22 on the base substrate 1 are sequentially distributed in a first direction X. The orthographic projection of the first channel portion 21 on the base substrate 1, the orthographic projection of the first doped portion 23 on the base substrate 1 and the orthographic projection of the second channel portion 22 on the base substrate 1 may be combined to form a rectangle. It should be understood that in other exemplary embodiments, the orthographic projection of the first channel portion 21 on the base substrate 1, the orthographic projection of the first doped portion 23 on the base substrate 1, and the orthographic projection of the second channel portion 22 on the base substrate 1 may also have another shape. For example, the orthographic projection of the first channel portion 21 on the base substrate 1, the orthographic projection of the first doped portion 23 on the base substrate 1, and the orthographic projection of the second channel portion 22 on the base substrate 1 may be trapezoidal. The orthographic projection of the first channel portion 21 on the base substrate 1, the orthographic projection of the first doped portion 23 on the base substrate 1, and the orthographic projection of the second channel portion 22 on the base substrate 1 may form a pattern with another shape, which belongs to the protection scope of the present disclosure.

In this exemplary embodiment, the larger the size of the orthographic projection of the second channel portion 22 on the base substrate 1 in the first direction X, the smaller the leakage current of the thin film transistor when the thin film transistor is turned off, and the larger an absolute value of a threshold voltage of the thin film transistor. The larger the size of the orthographic projection of the first doped portion on the base substrate in the first direction X, the smaller the leakage current of the thin film transistor when the thin film transistor is turned off, and the smaller the absolute value of the threshold voltage of the thin film transistor. In this exemplary embodiment, the size of the orthographic projection of the first channel portion 21 on the base substrate 1 in the first direction X is S1, and the size of the orthographic projection of the second channel portion 22 on the base substrate 1 in the first direction X is S2. A value of S1/S2 may be 3-15. The size of the orthographic projection of the first doped portion on the base substrate in the first direction is L, and a value of S1/L may be 3-15. When the size of the orthographic projection of the first doped portion on the base substrate in the first direction and the size of the orthographic projection of the second channel portion 22 on the base substrate in the first direction X are the values as mentioned above, the thin film transistor has lower leakage current and closer threshold voltage than a structure without the second channel portion and the second gate portion. Specifically, in this exemplary embodiment, S1 may be equal to 2.8-3.2 microns, and for example, S1 may be equal to 2.8 microns, 3 microns and 3.2 microns. S2 may be equal to 0.2-0.8 microns, and for example, S2 may be equal to 0.2 microns, 0.3 microns, 0.5 microns and 0.8 microns. L may be equal to 0.2-0.8 microns, and for example, L may be equal to 0.2 microns, 0.3 microns, 0.5 microns and 0.8 microns. S2 may be equal to L, and for example, S2 and L may both be equal to 0.5 microns.

In this exemplary embodiment, as shown in FIGS. 1 and 2, the semiconductor material layer may further include a second doped portion 24 and a third doped portion 25. The second doped portion 24 may be connected to the first channel portion 21, and the third doped portion 25 may be connected to the second channel portion 22. The thin film transistor may further include a second insulating layer 5 and a source/drain layer, and the second insulating layer 5 is located at a side of the gate layer facing away from the base substrate 1. A first via hole 51 and a second via hole 52 are formed on the first insulating layer 3 and the second insulating layer 5 and each of the first via hole 51 and the second via hole 52 penetrates through both the first insulating layer 3 and the second insulating layer 5. An orthographic projection of the first via hole 51 on the base substrate may be located on the orthographic projection of the second doped portion 24 on the base substrate 1, and an orthographic projection of the second via hole 52 on the base substrate may be located on the orthographic projection of third doped portion 25 on the base substrate. The source/drain layer may be located at a side of the second insulating layer 5 facing away from the base substrate, and the source/drain layer may include a first conductive portion 61 and a second conductive portion 62. The first conductive portion 61 may be connected with the second doped portion 24 through the first via hole 51 for forming a first electrode of the thin film transistor; and the second conductive portion 62 may be connected to the third doped portion 25 through the second via hole 52 for forming a second electrode of the thin film transistor.

Figure 3:
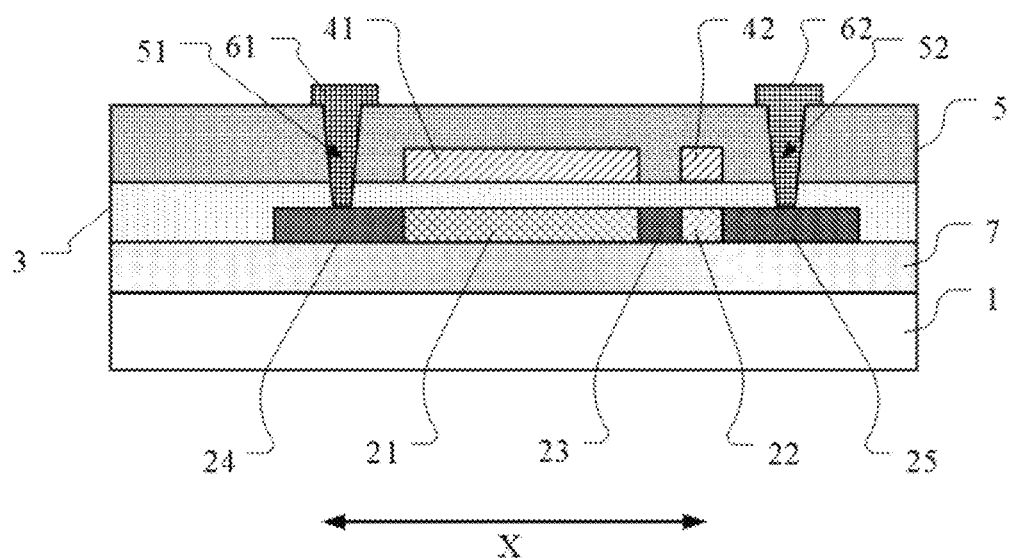
FIG. 3 is a structural schematic view of the thin film transistor according to another exemplary embodiment of the present disclosure.

In this exemplary embodiment, FIG. 3 is a structural schematic view of the thin film transistor according to another exemplary embodiment of the present disclosure. A buffer layer 7 may be provided at a side of the base substrate 1, and the thin film transistor may be provided at a side of the buffer layer 7 facing away from the base substrate 1.

Figure 4:
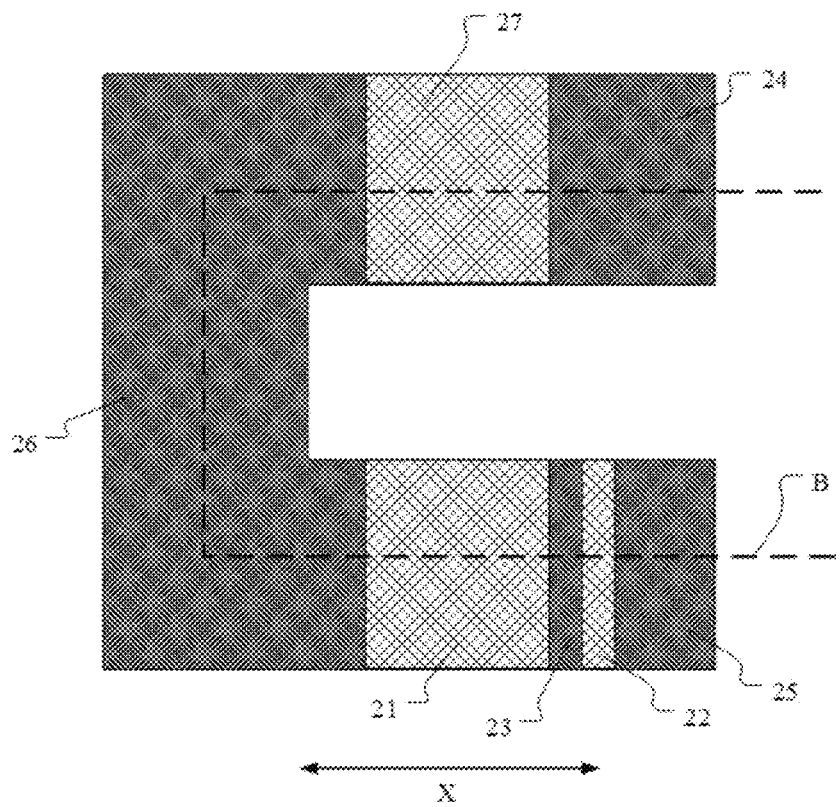
FIG. 4 is a top view of the thin film transistor according to another exemplary embodiment of the present disclosure.
Figure 5:
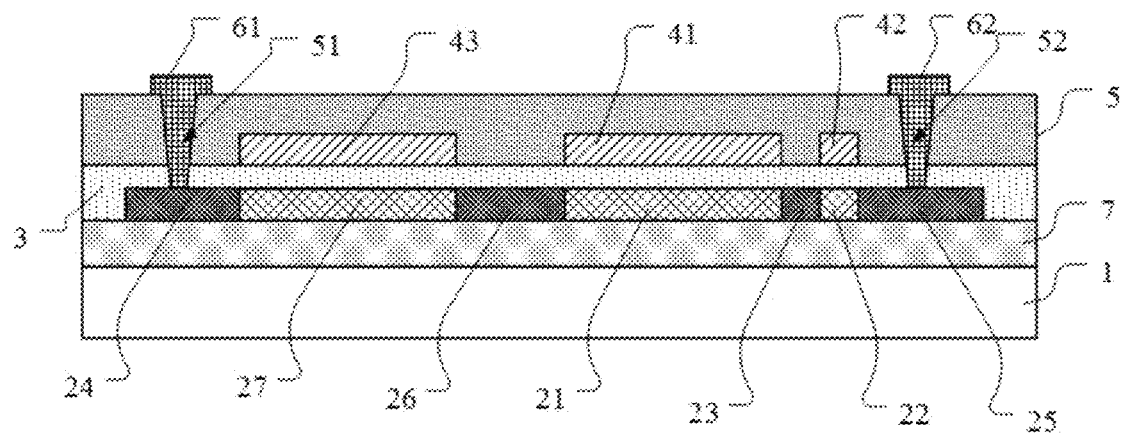
FIG. 5 is a cross-sectional view at a position of dashed line B in FIG. 4.

In this exemplary embodiment, as shown in FIGS. 4 and 5, FIG. 4 is a top view of the thin film transistor according to another exemplary embodiment of the present disclosure, and FIG. 5 is a cross-sectional view at a position of dashed line B in FIG. 4. FIG. 4 only shows the structural layout of the semiconductor material layer in the thin film transistor. The semiconductor material layer may also include a fourth doped portion 26 and a third channel portion 27, the fourth doped portion 26 may be connected between the first channel portion 21 and the second doped portion 24, and the third channel portion 27 may be connected between the second doped portion 24 and the fourth doped portion 26. The gate layer may further include a third gate portion 43, an orthographic projection of the third gate portion 43 on the base substrate may cover the orthographic projection of the third channel portion on the base substrate, and the third gate portion 43 may be electrically connected with the first gate portion 41.

When the thin film transistor is operated, the first gate portion 41 and the third gate portion 43 may be connected to the control signal terminal. The third channel portion 27 may further reduce the leakage current when the thin film transistor is turned off.

Figure 6:
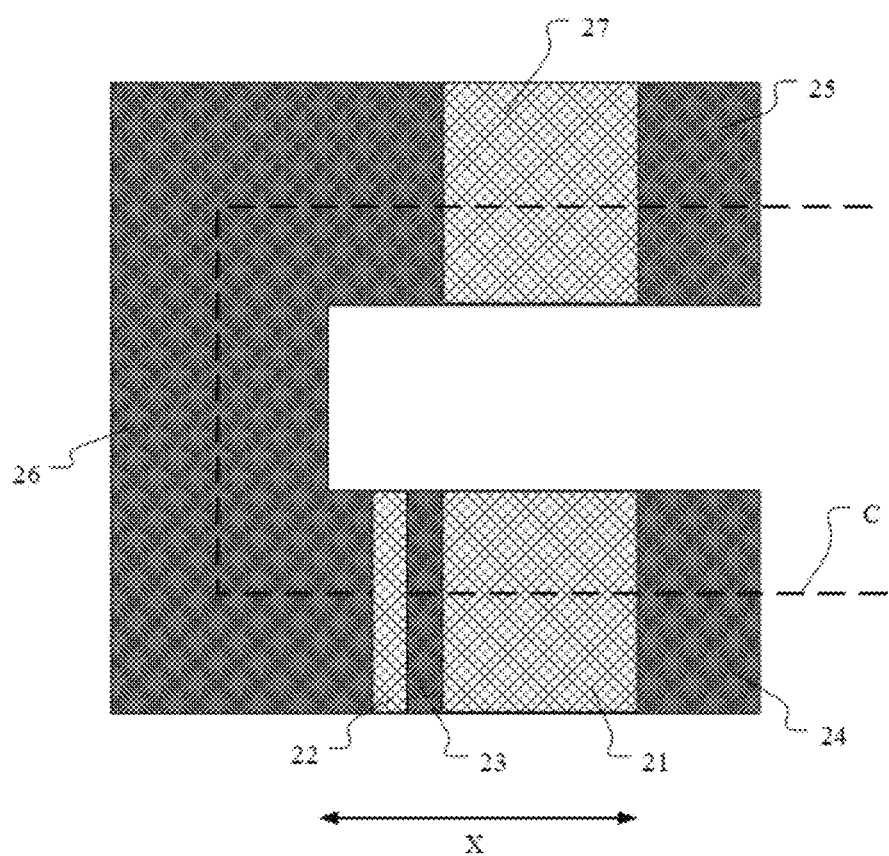
FIG. 6 is a top view of the thin film transistor according to another exemplary embodiment of the present disclosure.
Figure 7:
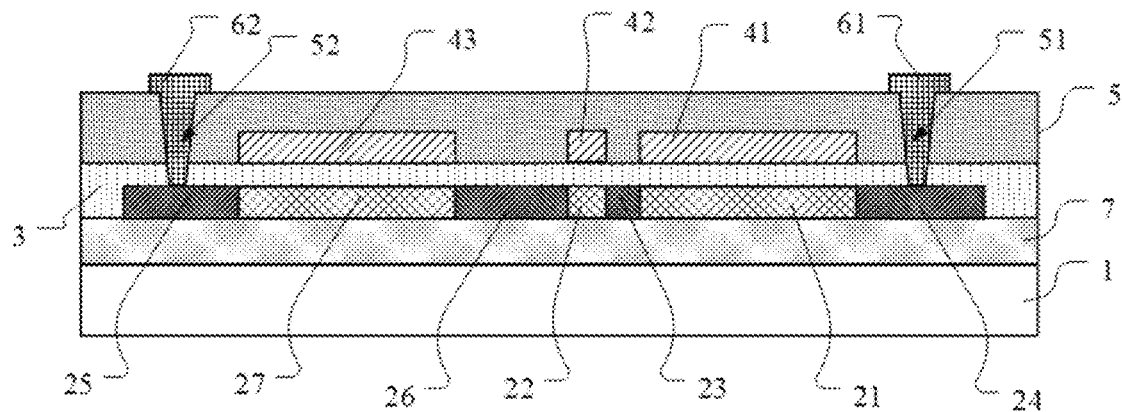
FIG. 7 is a cross-sectional view at a position of dashed line C in FIG. 6.

In this exemplary embodiment, as shown in FIGS. 6 and 7, FIG. 6 is a top view of the thin film transistor according to another exemplary embodiment of the present disclosure, and FIG. 7 is a cross-sectional view at a position of dashed line C in FIG. 6. FIG. 6 only shows a structural layout of the semiconductor material layer in the thin film transistor. The semiconductor material layer may also include a fourth doped portion 26 and a third channel portion 27. The fourth doped portion 26 is connected between the second channel portion 22 and the third doped portion 25, and the third channel portion 27 may be connected between the third doped portion 25 and the fourth doped portion 26. The gate layer may further include a third gate portion 43, an orthographic projection of the third gate portion 43 on the base substrate may cover the orthographic projection of the third channel portion 27 on the base substrate, and the third gate portion 43 may be electrically connected with the first gate portion 41.

When the thin film transistor is operated, the first gate portion 41 and the third gate portion 43 may be connected to the control signal terminal. The third channel portion 27 may further reduce the leakage current when the thin film transistor is turned off.

This exemplary embodiment also provides a display panel including at least one of the thin film transistors as described above.

Figure 8:
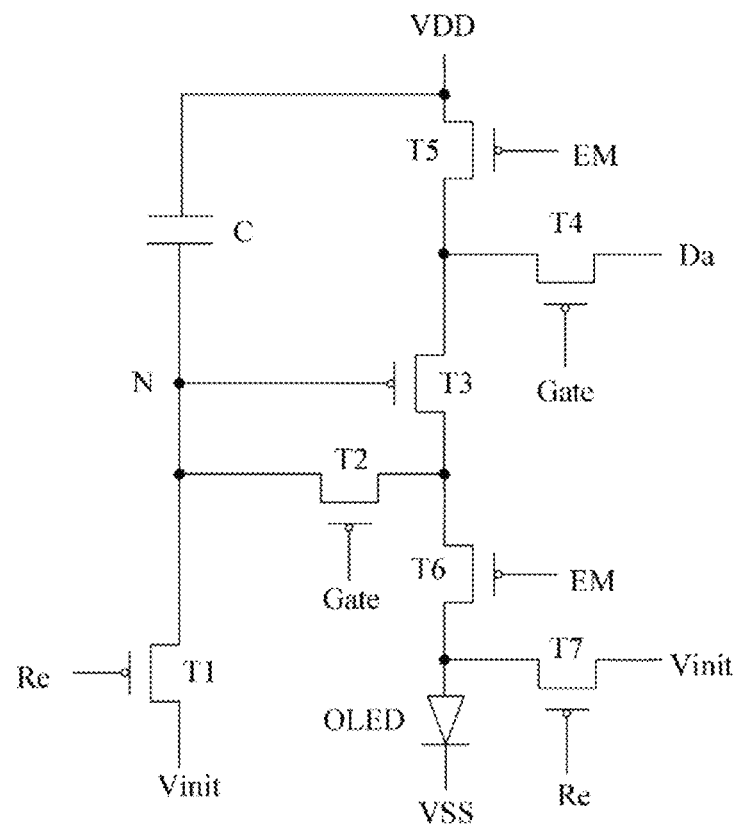
FIG. 8 is a structural schematic view of a pixel driving circuit of the display panel according to an exemplary embodiment of the present disclosure.

FIG. 8 is a structural schematic view of a pixel driving circuit of the display panel according to an exemplary embodiment of the present disclosure. The pixel driving circuit may include a first transistor T1, a second transistor T2, a driving transistor T3, a fourth transistor T4, a fifth transistor T5, a sixth transistor T6, a seventh transistor T7, and a capacitor C. The first transistor T1 has a second electrode connected to a node N, a first electrode connected to an initial signal terminal Vinit and a gate connected to a reset signal terminal RE. The second transistor T2 has a first electrode connected to a first electrode of the driving transistor T3, a second electrode connected to the node N, and a gate connected to a gate driving signal terminal Gate. A gate of the driving transistor T3 is connected to the node N. The fourth transistor T4 has a first electrode connected to a data signal terminal Da, a second electrode connected to a second electrode of the driving transistor T3, and a gate connected to the gate driving signal terminal Gate. The fifth transistor T5 has a first electrode connected to a first power signal terminal VDD, a second electrode connected to the second electrode of the driving transistor T3, and a gate connected to an enable signal terminal EM. The sixth transistor T6 has a first electrode connected to the first electrode of the driving transistor T3, and a gate connected to the enable signal terminal EM. The seventh transistor T7 has a first electrode connected to the initial signal terminal Vinit, a second electrode connected to the second electrode of the sixth transistor T6, and a gate connected to the reset signal terminal Re. The capacitor C has a first electrode connected to the gate of the driving transistor T3, and a second electrode connected to the first power signal terminal VDD. The pixel driving circuit may be connected with a light emitting unit OLED for driving the light emitting unit OLED to emit light, and the light emitting unit OLED may be connected between the second electrode of the sixth transistor T6 and a second power terminal VSS. The transistors T1-T7 may all be P-type transistors.

Figure 9:
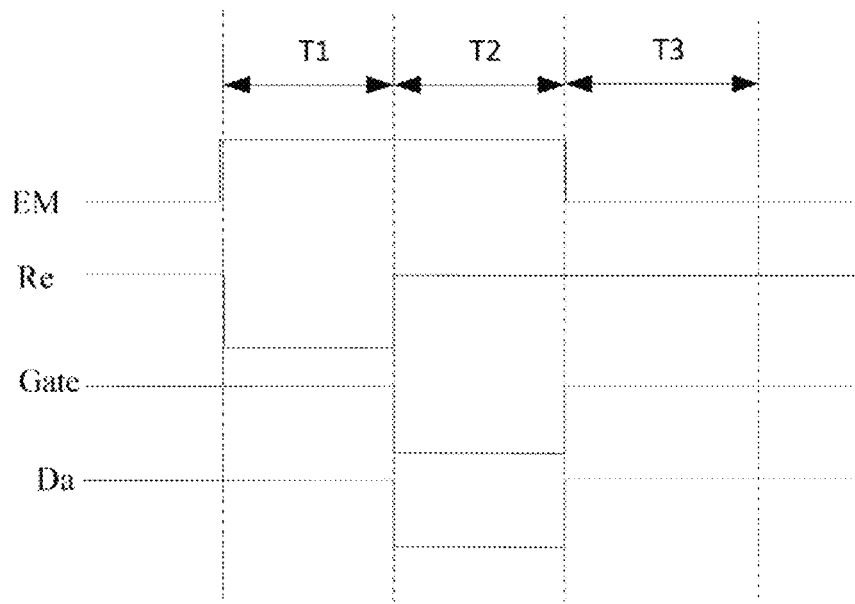
FIG. 9 is a timing diagram of nodes in a driving method of the pixel driving circuit in FIG. 8.

FIG. 9 is a timing diagram of nodes in a driving method of the pixel driving circuit in FIG. 8. Gate represents a timing of the gate driving signal terminal Gate, Re represents a timing of the reset signal terminal Re, EM represents a timing of the enable signal terminal EM, and Da represents a timing of the data signal terminal Da. A driving method of the pixel driving circuit may include a reset stage t1, a compensation stage t2, and a light emitting stage t3. In the reset stage T1, the reset signal terminal Re outputs a low-level signal, the first transistor T1 and the seventh transistor T7 are turned on, and the initial signal terminal Vinit inputs an initial signal to the node N and the second electrode of the sixth transistor T6. In the compensation stage t2, the gate driving signal terminal Gate outputs a low-level signal, the fourth transistor T4 and the second transistor T2 are turned on, and the data signal terminal Da outputs a driving signal to write a voltage Vdata+Vth to the node N, where Vdata is a voltage of the driving signal and Vth is a threshold voltage of the driving transistor T3. In the light emitting stage t3, the enable signal terminal EM outputs a low-level signal, the sixth transistor T6 and the fifth transistor T5 are turned on, and the driving transistor T3 emits light under the action of the voltage Vdata+Vth stored in the capacitor C. According to the driving transistor output current formula $I=(\mu WCox/2L)(Vgs-Vth)^2$, where μ is carrier mobility; Cox is gate capacitance per unit area, W is a width of the driving transistor channel, L is a length of the driving transistor channel, Vgs is a gate-source voltage difference of the driving transistor, and Vth is a threshold voltage of the driving transistor. An output current of the driving transistor in the pixel driving circuit of the present disclosure is $I=(\mu WCox/2L)(Vdata+Vth-Vdd-Vth)^2$. The pixel driving circuit may avoid the influence of the threshold of the driving transistor on its output current.

In the light emitting stage, the node N in the pixel driving circuit tends to generate electric leakage through the first transistor T1 and the second transistor T2, thereby affecting the normal display. The first transistor T1 and the second transistor T2 in the pixel driving circuit may adopt the structure of the thin film transistor as described above, so that the leakage current of the node N through the first transistor T1 and the second transistor T2 may be reduced. In addition, the transistor in the pixel driving circuit may be a low-temperature polysilicon transistor. The low-temperature polysilicon transistor has high carrier mobility, which facilitates to realize a display panel with high resolution, high reaction speed, high pixel density and high aperture ratio.

It should be understood that in other exemplary embodiments, the thin film transistor may also be applied to other circuit structures in the display panel. For example, the thin film transistor may also be applied to the gate driving circuit in the display panel. The pixel driving circuit in the display panel may also have other circuit structures, and correspondingly, the thin film transistor may be applied to the transistor connected with the gate of the driving transistor. The driving transistor may refer to a transistor in the pixel driving circuit that supplies driving current to the light emitting unit according to the data signal.

Figure 10:
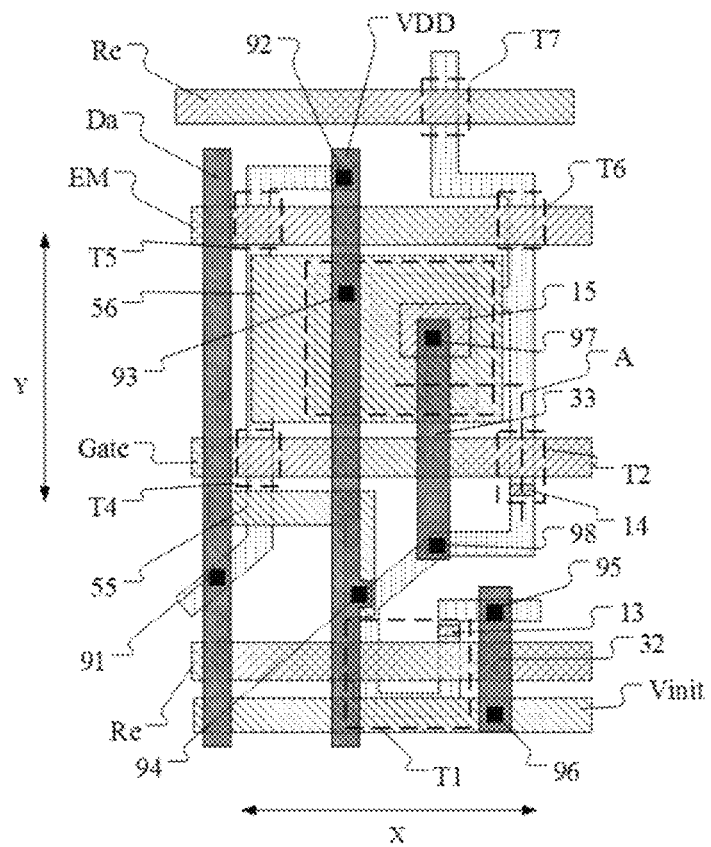
FIG. 10 is a structural layout of the display panel according to an exemplary embodiment of the present disclosure.
Figure 11:
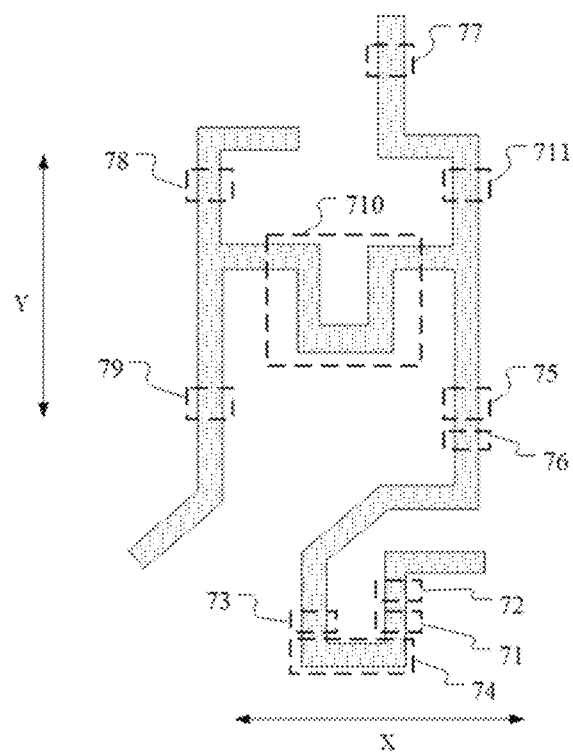
FIG. 11 is a structural layout of an active layer in FIG. 10.
Figure 12:
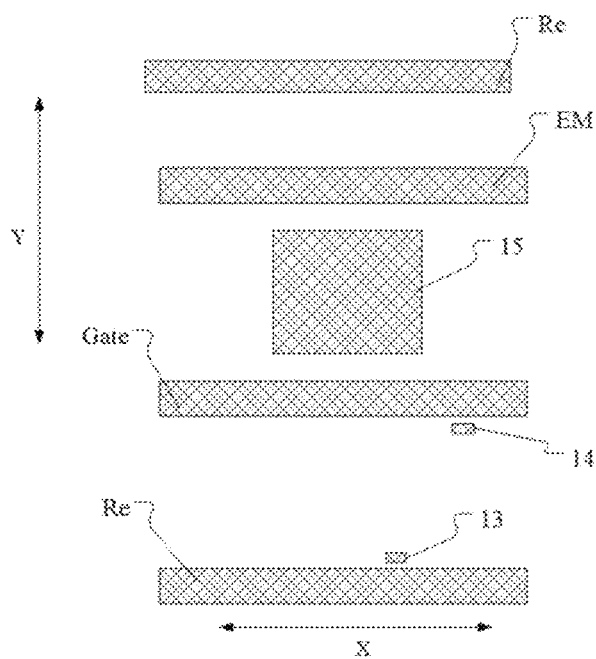
FIG. 12 is a structural layout of a first conductive layer in FIG. 10.
Figure 13:
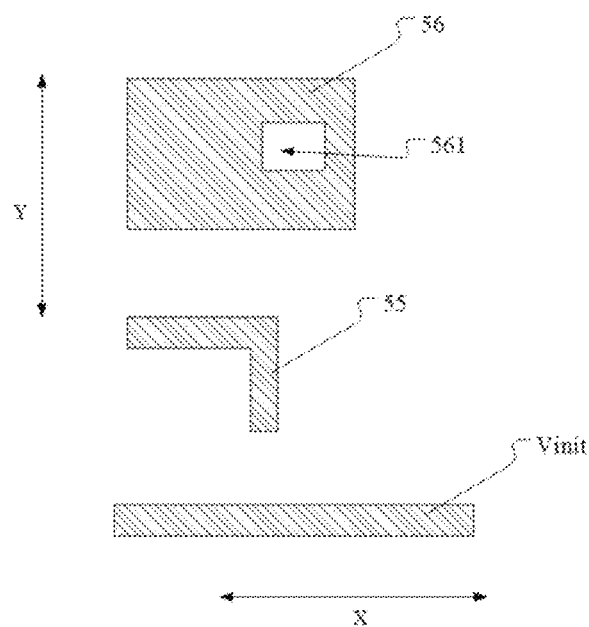
FIG. 13 is a structural layout of a second conductive layer in FIG. 10.
Figure 14:
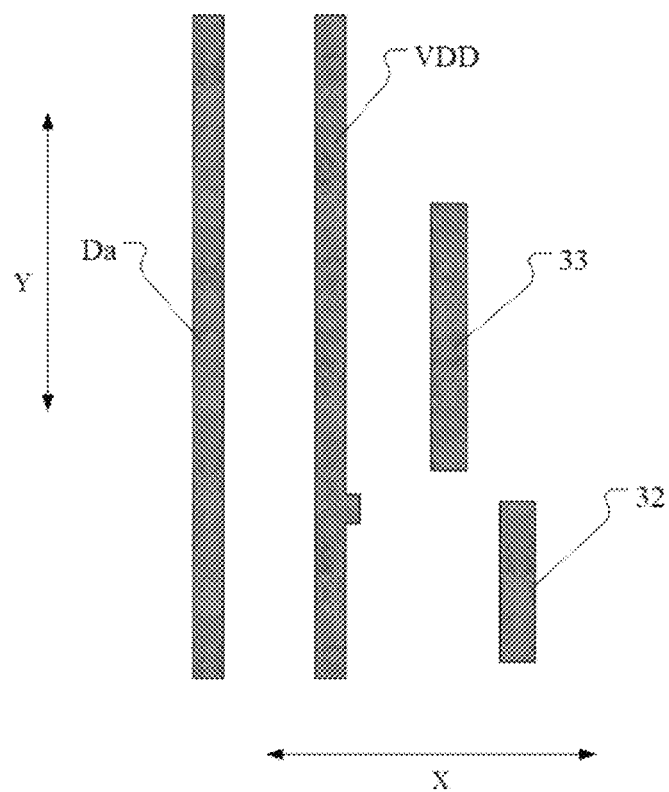
FIG. 14 is a structural layout of a third conductive layer in FIG. 10.
Figure 15:
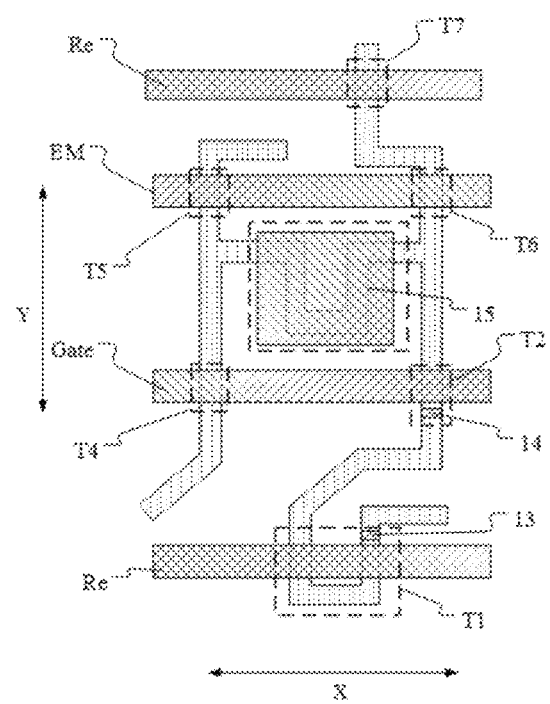
FIG. 15 is a structural layout of the active layer and the first conductive layer in FIG. 10.
Figure 16:
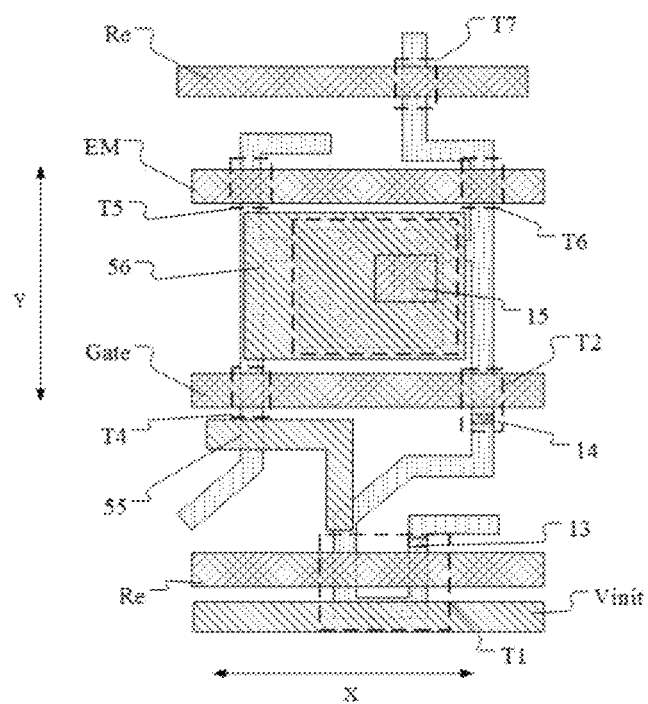
FIG. 16 is a structural layout of the active layer, the first conductive layer and the second conductive layer in FIG. 10.

In this exemplary embodiment, the display panel may include a base substrate, an active layer, a first conductive layer, a second conductive layer and a third conductive layer sequentially laminated. The active layer is arranged at a side of the base substrate, the first conductive layer is arranged at a side of the active layer facing away from the base substrate, the second conductive layer is arranged at a side of the first conductive layer facing away from the base substrate, and the third conductive layer is arranged at a side of the second conductive layer facing away from the base substrate. As shown in FIGS. 10-16, FIG. 10 is a structural layout of the display panel according to an exemplary embodiment of the present disclosure, FIG. 11 is a structural layout of an active layer in FIG. 10, FIG. 12 is a structural layout of a first conductive layer in FIG. 10, FIG. 13 is a structural layout of a second conductive layer in FIG. 10, FIG. 14 is a structural layout of a third conductive layer in FIG. 10, FIG. 15 is a structural layout of the active layer and the first conductive layer in FIG. 10, and FIG. 16 is a structural layout of the active layer, the first conductive layer and the second conductive layer in FIG. 10.

As shown in FIGS. 10, 11, 15, and 16, the active layer may include a first active portion 71, a second active portion 72, a third active portion 73, a fourth active portion 74, a fifth active portion 75, a sixth active portion 76, a seventh active portion 77, an eighth active portion 78, a ninth active portion 79, a tenth active portion 710, and an eleventh active portion 710. The first active portion 71 may be configured to form a first channel portion of the first transistor T1. The second active portion 72 may be configured to form a second channel portion of the first transistor T1. An orthographic projection of the first active portion 71 on the base substrate and an orthographic projection of the second active portion 72 on the base substrate may be distributed in a fourth direction Y. The third active portion 73 may be configured to form a third channel portion of the first transistor T1. The fourth active portion 74 may be configured to form a fourth doped portion of the first transistor T1. The fifth active portion 75 may be configured to form a first channel portion of the second transistor T2. The sixth active portion 76 may be configured to form a second channel portion of the second transistor T2. The seventh active portion 77 may be configured to form a channel portion of the seventh transistor T7. The eighth active portion 78 may be configured to form a channel portion of the fifth transistor T5. The ninth active portion 79 may be configured to form a channel portion of the fourth transistor T4. The tenth active portion 710 may be configured to form a channel portion of the driving transistor T3. The eleventh transistor T11 may be configured to form a channel portion of the sixth transistor T6.

As shown in FIGS. 10, 12, 15 and 16, the first conductive layer may include a first gate line Re, a third conductive portion 13, a third gate line Gate, a fourth conductive portion 14, a fifth gate line EM and a fifth conductive portion 15. The first gate line Re is configured to provide a reset signal terminal Re as shown in FIG. 8. An orthographic projection of the first gate line Re on the base substrate may extend in a third direction X, and may cover an orthographic projection of the first active portion 71 on the base substrate. A part of the first gate line Re may be configured to form a first gate of the first transistor T1. The third direction X and the fourth direction Y may intersect with each other, and for example, the third direction X is perpendicular to the fourth direction Y. The orthographic projection of the first gate line Re on the base substrate may also cover an orthographic projection of the third active portion 73 on the base substrate, and a part of the first gate line Re may be configured to form a third gate of the first transistor T1. The third gate line Gate may be configured to provide a gate driving signal terminal Gate in FIG. 8, an orthographic projection of the third gate line Gate on the base substrate may extend in the third direction X, and may cover an orthographic projection of the fifth active portion 75 on the base substrate, and a part of the third gate line Gate may be configured to form the first gate of the second transistor T2. An orthographic projection of the third conductive portion 13 on the base substrate may cover an orthographic projection of the second active portion 72 on the base substrate, and the third conductive portion 13 may be configured to form the second gate of the first transistor T1. An orthographic projection of the fourth conductive portion 14 on the base substrate may cover an orthographic projection of the sixth active portion 76 on the base substrate, and the fourth conductive portion 14 may be configured to form the second gate of the second transistor T2. The fifth conductive portion 15 may be configured to form the gate of the driving transistor T3 and the first electrode of the capacitor C. As shown in FIGS. 10, 12, 15 and 16, the gate of the seventh transistor T7 may share a part of the structure of the first gate line Re in the previous pixel row.

As shown in FIGS. 10, 13 and 16, the second conductive layer may include a sixth conductive portion 56, a first connecting portion 55 and a second gate line Vinit. An orthographic projection of the sixth conductive portion 56 on the base substrate may at least partially overlap with an orthographic projection of the fifth conductive portion 15 on the base substrate, and the sixth conductive portion 56 may be configured to form the second electrode of the capacitor C. The sixth conductive portion 56 may be provided with an opening 561. The second gate line Vinit may be configured to provide the initial signal terminal Vinit in FIG. 8, and an orthographic projection of the second gate line Vinit on the base substrate may extend in the third direction X.

Figure 17:
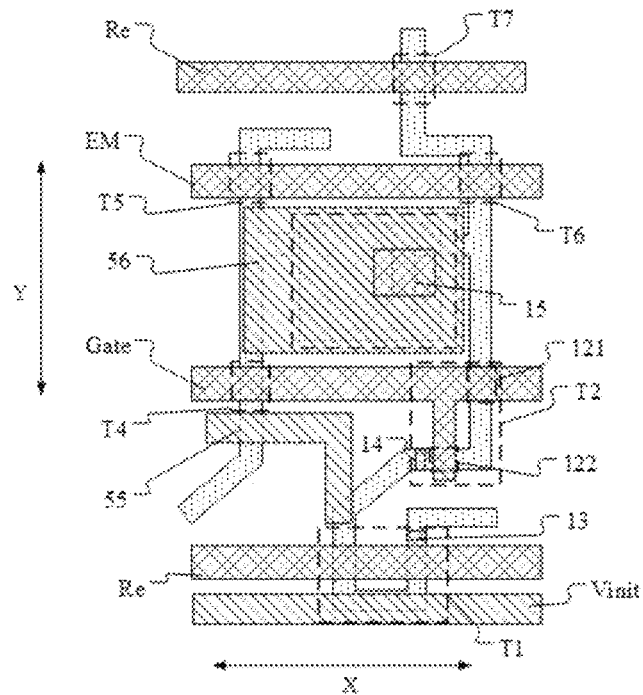
FIG. 17 is a partial structural layout of the display panel according to another exemplary embodiment of the present disclosure.

As shown in FIG. 17, FIG. 17 is a partial structural layout of the display panel according to another exemplary embodiment of the present disclosure. The second transistor T2 may have a double-gate structure, that is, in addition to the fourth conductive portion 14 for forming its second gate, the second transistor T2 may also include a gate 121 and a gate 122, and correspondingly, the second transistor T2 includes two channel portions corresponding to the gate 121 and the gate 122 respectively. The gates 121 and 122 may be located in the first conductive layer, and the two channel portions corresponding to the gates 121 and 122 may be located in the active layer. The second transistor T2 having the double-gate structure may have a smaller leakage current.

Figure 18:
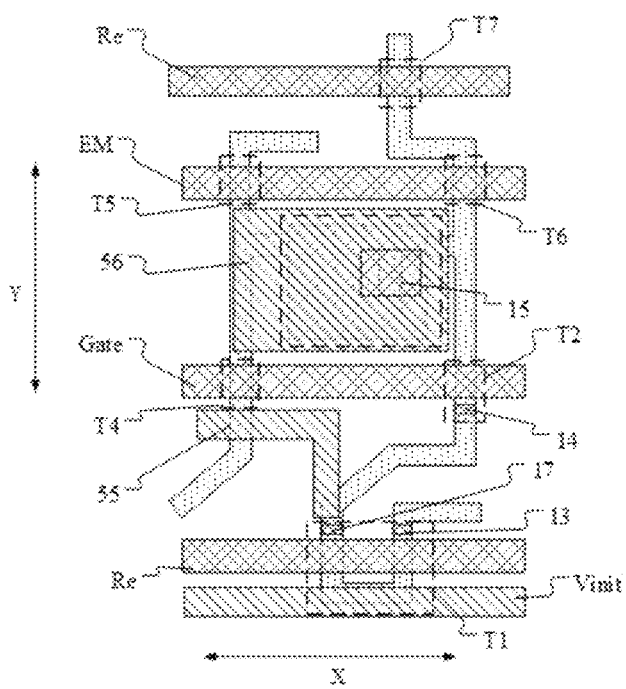
FIG. 18 is a partial structural layout of the display panel according to another exemplary embodiment of the present disclosure.

As shown in FIG. 18, FIG. 18 is a partial structural layout of the display panel according to another exemplary embodiment of the present disclosure. The first transistor T1 may also include another gate 17 that is suspended. Correspondingly, the first transistor T1 includes a semiconductor channel portion corresponding to the gate 17, the semiconductor channel portion may be located in the active layer, and an orthographic projection of the semiconductor channel portion on the base substrate may coincide with an orthographic projection of the gate 17 on the base substrate. As shown in FIG. 18, the first transistor T1 may be provided with two suspended gates, so that the first transistor T1 has a smaller leakage current.

It should be understood that in other exemplary embodiments, the second gate of the transistor may also be located in other conductive layers. For example, the fourth conductive portion 14 as the second gate of the second transistor T2 may be located in the second conductive layer. In addition, in other exemplary embodiments, when the display panel includes other conductive layers, the second gate of the transistor may also be located in another conductive layer. For example, when the display panel includes one or more of gate layers, source/drain layers, a light shielding metal layer and an anode layer, the second gate of the transistor may be located in any one of the above-mentioned conductive layers. The light shielding metal layer may be located at a side of the active layer close to the base substrate for shielding the channel portion of the transistor. In other exemplary embodiments, the transistor may also include a plurality of suspended gates, and orthographic projections of the suspended gates on the base substrate may coincide with the orthographic projection of the second channel of the transistor on the base substrate. For example, the suspended gate of the transistor may adopt a double-layer structure, that is, a plurality of suspended gates may include two conductive portions, and the two conductive portions may be respectively arranged at both sides or a side of the second channel portion of the transistor in a laminated direction. In addition, the orthographic projections of the suspended gates of the transistor on the base substrate may also be located at different positions. Correspondingly, the transistor may also include a plurality of semiconductor channel portions arranged corresponding to the suspended gates, and orthographic projections of the semiconductor channel portions on the base substrate may coincide with the orthographic projections of the corresponding suspended gates on the base substrate. The orthographic projections of the suspended gates on the base substrate may be located at a side or both sides of the orthographic projection of a normal gate of the transistor on the base substrate, wherein the normal gate of the transistor may refer to a gate receiving the gate driving signal.

It should be understood that in other exemplary embodiments, one of the first transistor T1 and the second transistor T2 may be a metal oxide transistor, and the other may be a low-temperature polysilicon transistor. The metal oxide transistor has smaller leakage current. The display panel may include a first active layer, a first gate layer, a second active layer, and a second gate layer which are sequentially laminated. The first active layer may be formed of polycrystalline silicon, and a part of the first active layer may serve as a channel portion of the low-temperature polysilicon transistor. The second active layer may be formed of metal oxide (for example, indium gallium zinc oxide IGZO), and a part of the second active layer may serve as a channel portion of the metal oxide transistor. A part of the first gate layer may be configured to form a gate of low temperature polysilicon transistor, a part of the first gate layer may be configured to form a bottom gate of the metal oxide transistor, and a part of the second gate layer may be configured to form a top gate of metal oxide transistor. The suspended gate of the low-temperature polysilicon transistor may be formed by one or more of the part of the second active layer, the part of the first gate layer and the part of the second gate layer that are conducted.

As shown in FIGS. 10 and 14, the third conductive layer may include a data line Da, a power line VDD, a second connecting portion 32, and a third connecting portion 33. The data line Da may be configured to provide the data signal terminal Da in FIG. 8, and an orthographic projection of the data line Da on the base substrate may extend in the fourth direction Y. The power line VDD may be configured to provide the first power terminal VDD in FIG. 8, and an orthographic projection of the power line VDD on the base substrate may extend in the fourth direction Y. The data line Da is connected to the ninth active portion 79 through a via hole 91 to connect the data signal terminal and the first electrode of the fourth transistor T4. The power line VDD may be connected to the eighth active portion 78 through a via hole 92 to connect the first power terminal and the first electrode of the fifth transistor T5. The power line VDD is also connected to the sixth conductive portion 56 through the through hole 93 to connect the second electrode portion of the capacitor C and the first power terminal. The power line VDD is also connected to the first connection portion 55 through a via hole 94. The second connecting portion 32 may be connected to the second active portion 72 through a via hole 95 and the second gate line Vinit through a via hole 96 to connect the second electrode of the first transistor T1 and the initial signal terminal. The third connecting portion 33 may be connected to the fifth conductive portion 15 through a via hole 97 and the sixth active portion 76 through a via hole 98 to connect the second electrode of the second transistor T2 and the gate of the driving transistor T3. An orthographic projection of the via hole 97 on the base substrate may be located within an orthographic projection of the opening 561 on the base substrate.

As shown in FIGS. 10, 15, and 16, the orthographic projection of the third conductive portion 13 on the base substrate may be located at a side of an orthographic projection of the first gate line R2 on the base substrate away from an orthographic projection of the second gate line Vinit on the base substrate. On the one hand, this arrangement may reserve sufficient layout space for the third conductive portion 13; and on the other hand, the second gate line Vinit may output an initial signal of stable voltage, and has a voltage stabilizing effect on the third conductive portion 13. When the first transistor T1 needs to be turned on, the second gate line Vinit reduces a voltage change of the third conductive portion 13 with the first gate line Re, thereby reducing the turn-on degree of the first transistor T1. In this embodiment, the third conductive portion 13 is arranged away from the second gate line Vinit, which may reduce the voltage stabilizing effect of the second gate line Vinit on the third conductive portion 13, thereby reducing the influence of the second gate line Vinit on the conduction degree of the first transistor. It should be understood that in other exemplary embodiments, the orthographic projection of the third conductive portion 13 on the base substrate may also be located at a side of the orthographic projection of the first gate line Re on the base substrate close to the orthographic projection of the second gate line Vinit on the base substrate, which belongs to the protection scope of the present disclosure.

As shown in FIGS. 10, 11, 15, and 16, the fourth active portion 74 is coupled with the first gate line Re, and a voltage of the fourth active portion 74 changes with the change of a potential of the first gate line Re, thereby causing the fourth active portion 74 to generate electric leakage to the source/drain of the first transistor T1. In this exemplary embodiment, the orthographic projection of the fourth active portion 74 on the base substrate may be located at a side of the orthographic projection of the first gate line Re on the base substrate away from the orthographic projection of the third conductive portion 13 on the base substrate. The orthographic projection of the second gate line Vinit on the base substrate may at least partially coincide with the orthographic projection of the fourth active portion 74 on the base substrate. The second gate line Vinit may stabilize the voltage of the fourth active portion 74, thereby preventing the fourth active portion 74 from generating electric leakage to the source/drain of the first transistor T1.

As shown in FIGS. 10, 11 and 14, the orthographic projection of the first active portion 71 on the base substrate may be located at a side of the orthographic projection of the third active portion 73 on the base substrate away from the orthographic projection of the power line VDD on the base substrate. On the one hand, this arrangement can reserve sufficient layout space for the third conductive portion 13; and on the other hand, since the power line VDD may output a stable voltage, when the first transistor T1 needs to be turned on, the power line VDD reduces the voltage change of the third conductive portion 13 with the first gate line Re, thereby reducing the turn-on degree of the first transistor T1. In this exemplary embodiment, the third conductive portion 13 is located away from the power line VDD, which can reduce the voltage stabilizing effect of the power line VDD on the third conductive portion 13, thereby reducing the influence of the power line VDD on the conduction degree of the first transistor. It should be understood that in other exemplary embodiments, the orthographic projection of the first active portion on the base substrate may also be located at a side of the orthographic projection of the third active portion 73 on the base substrate close to the orthographic projection of the power line VDD on the base substrate, which belongs to the protection scope of the present disclosure.

In this exemplary embodiment, the orthographic projection of the sixth conductive portion 56 on the base substrate may be located at a side of the orthographic projection of the third gate line Gate on the base substrate away from the orthographic projection of the first gate line Re on the base substrate. The orthographic projection of the fourth conductive portion 14 on the base substrate may be located between the orthographic projection of the third gate line Gate on the base substrate and the orthographic projection of the first gate line Re on the base substrate. On the one hand, this arrangement can reserve sufficient layout space for the fourth conductive portion 14; and on the other hand, since the sixth conductive portion 56 is connected to the power line VDD, the sixth conductive portion 56 reduces the voltage change of the fourth conductive portion 14 with the third gate line Gate in the turn-on stage of the second transistor T2, thereby reducing the turn-on degree of the second transistor T2. In this exemplary embodiment, the fourth conductive portion 14 is arranged away from the sixth conductive portion 56, and may reduce the voltage stabilizing effect of the sixth conductive portion 56 on the fourth conductive portion 14, thereby reducing the influence of the sixth conductive portion 56 on the conduction degree of the second transistor. It should be understood that in other exemplary embodiments, the orthographic projection of the fourth conductive portion 14 on the base substrate may be located between the orthographic projection of the third gate line Gate on the base substrate and the orthographic projection of the sixth conductive portion 56 on the base substrate close to the orthographic projection of the sixth conductive portion 56 on the base substrate.

Figure 19:
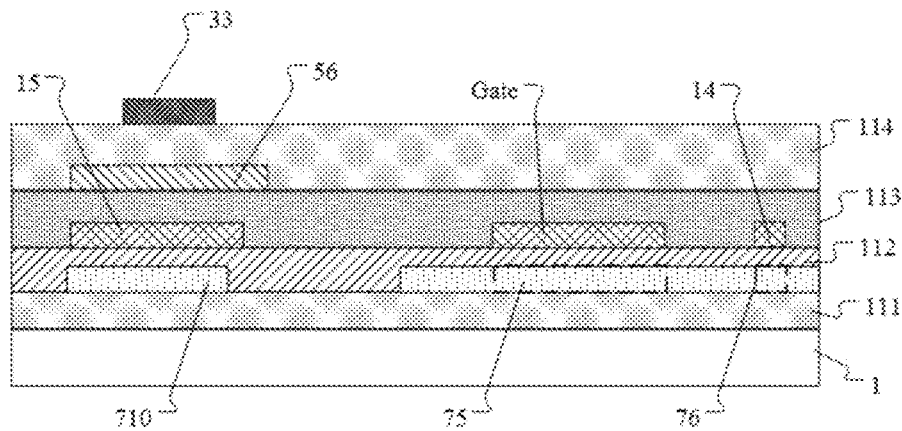
FIG. 19 is a partial sectional view at the dashed line A in FIG. 10.

As shown in FIG. 19, FIG. 19 is a partial sectional view at the dashed line A in FIG. 10. The display panel may also include a buffer layer 111, a first insulating layer 112, a second insulating layer 113 and a dielectric layer 114. The base substrate 1, the active layer, the first insulating layer, the first conductive layer, the second insulating layer, the second conductive layer, the dielectric layer and the third conductive layer are sequentially laminated. The insulating layer may be a silicon oxide layer and the dielectric layer may be a silicon nitride layer. The buffer layer may be made of silicon nitride or silicon oxide. The active layer may be made of polysilicon. Each of the first conductive layer, the second conductive layer and the third conductive layer may be formed of at least one metal layer. The base substrate may be formed of an insulating material. For example, the base substrate may include a first polyimide (PI) layer, a first silicon oxide (SiO) layer, an amorphous silicon layer, a second polyimide (PI) layer, and a second silicon oxide layer which are sequentially arranged. The second transistor T2 may also include another suspended gate located at a side of the buffer layer 111 facing the base substrate 1, and the orthographic projection of the suspended gate on the base substrate 1 may coincide with the orthographic projection of the fourth conductive portion 14 on the base substrate 1. The display panel may further reduce the leakage current of the first transistor T1 and the second transistor T2 by locally thinning the thickness of the first insulating layer 112. An orthographic projection of the thinned portion on the base substrate may coincide with an orthographic projection of the suspended gate (for example, the fourth conductive portion 14) on the base substrate.

Figure 20:
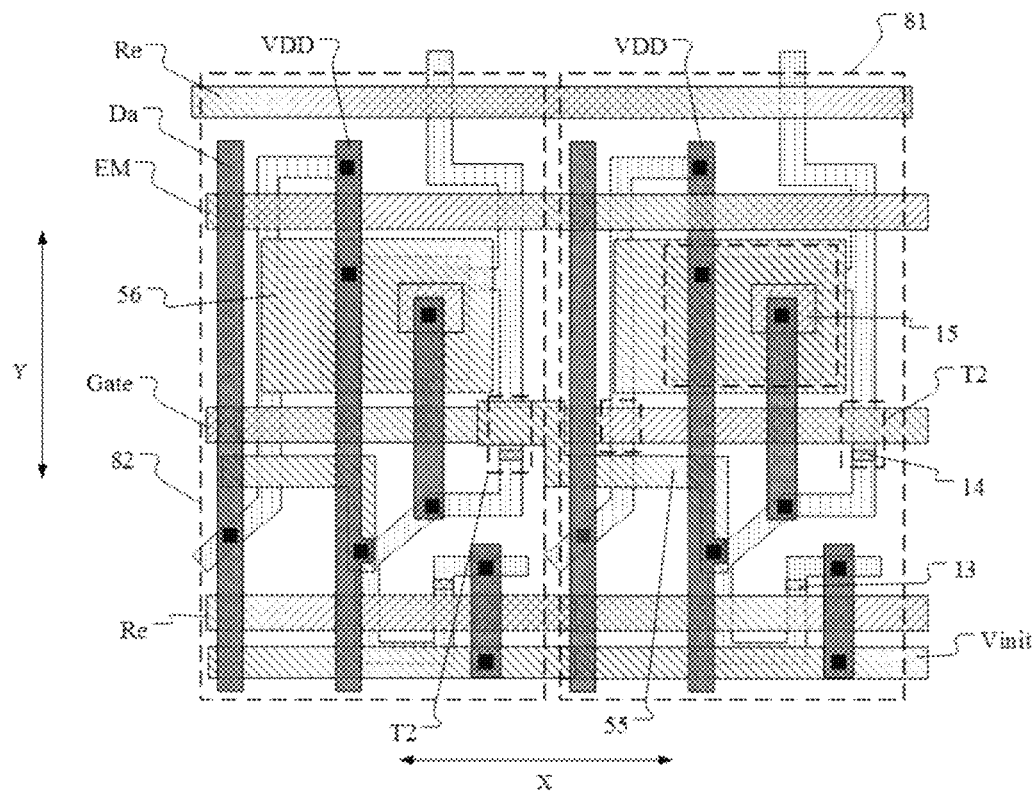
FIG. 20 is a structural schematic view of the display panel according to another exemplary embodiment of the present disclosure.

In this exemplary embodiment, as shown in FIG. 20, FIG. 20 is a structural schematic view of the display panel according to another exemplary embodiment of the present disclosure. The third direction X may be a row direction, and the display panel may include a first pixel driving circuit 81 and a second pixel driving circuit 82 adjacently arranged in the row direction. The first connecting portion 55 and the driving transistor in the first pixel driving circuit 01 are connected to the same power line VDD. An orthographic projection of the first connecting portion 55 on the base substrate may at least partially coincide with the orthographic projection of the first gate of the second transistor T2 in the second pixel driving circuit 82 on the base substrate. The first connecting portion 55 may shield a signal of the gate of the second transistor T2.

Figure 21:
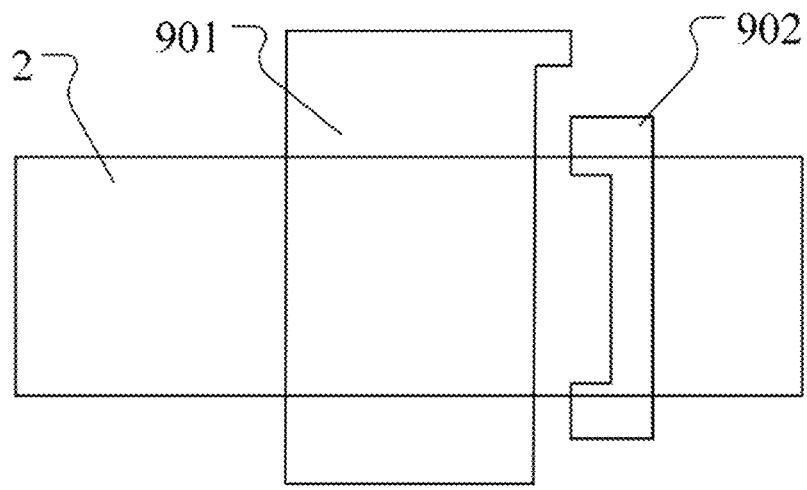
FIG. 21 is a partial structural view of a mask in an optical proximity correction mask technology of the present disclosure.

In this exemplary embodiment, the first conductive layer may be formed by a patterning process (including photolithography, development, and etching). However, in the photolithography process, due to the diffraction effect of light, a pattern projected by the mask onto a photoresist changes, such as the change of a line width, the rounding of a corner, the shortening of a line length or the like, thereby causing a pattern formed by the first conductive layer to be different from a preset pattern. In this exemplary embodiment, the first conductive layer may be formed by Optical Proximity Correction (OPC), that is, the first gate line Re, the third gate line Gate, the third conductive portion 13 and the fourth conductive portion 14 may be formed by one patterning process by using the optical proximity correction mask technology. The optical proximity correction mask technology is to pre-compensate a shape of the mask, so that the pattern projected by the mask onto the photoresist is the same as a preset image. As shown in FIG. 21, FIG. 21 is a partial structural view of a mask in an optical proximity correction mask technology of the present disclosure. An area 2 may represent a position where a part of the structure of the active layer is located, a position where a shielding portion 901 is located may be configured to form the third gate line, and a position where the shielding portion 902 is located may be configured to form the fourth conductive portion 14. As shown in FIG. 21, the mask pre-compensates the shielding portions 901 and 902, so that the mask may form the third gate line and the fourth conductive portion as shown in FIG. 10. The orthographic projection of the fourth conductive portion 14 on the base substrate may be rectangular, a size of the orthographic projection of the fourth conductive portion 14 on the base substrate in the first direction X may be equal to a size of the orthographic projection of the sixth active portion 76 on the base substrate in the first direction X.

In addition, it should be noted that in a manufacturing process of the display panel provided by this exemplary embodiment, the active layer may be doped by using the first conductive layer as a mask, that is, polysilicon semiconductor may be formed in a part of the active layer covered by the first conductive layer, and doped polysilicon conductor may be formed in a part of the active layer not covered by the first conductive layer.

Figure 22:
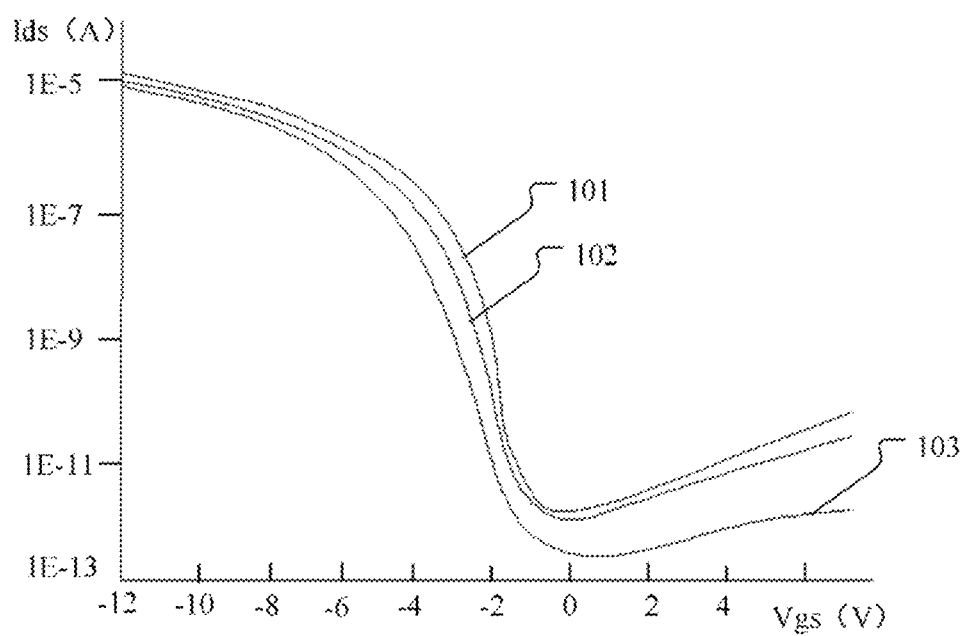
FIG. 22 is a graph showing a relationship between a leakage current of a second transistor and a gate-source voltage difference in the display panel of the present disclosure.

As shown in FIG. 22, FIG. 22 is a graph showing a relationship between a leakage current of a second transistor and a gate-source voltage difference in the display panel of the present disclosure. The abscissa represents the gate-source voltage difference of the second transistor, and the ordinate represents the leakage current of the second transistor. Curves 101, 102 and 103 respectively represent the leakage current curves of the second transistor in different structures and sizes. The curve 101 represents the leakage current of the second transistor in the conventional technology, in which the second transistor is not provided with a second gate and a second channel portion, and both a length and a width of the channel portion of the second transistor may be 3 microns. The curve 102 represents a structure adding a second gate and a second channel portion on the basis of the second transistor shown in the curve 101. The structure of the second transistor may be shown in FIGS. 1 and 2, in which a size S2 of the orthographic projection of the first channel portion on the base substrate in the first direction is 0.2 microns, and a size L of the orthographic projection of the first doped portion on the base substrate in the first direction is 0.3 microns. The curve 103 represents a structure adding a second gate and a second channel portion on the basis of the second transistor shown in the curve 101. The structure of the second transistor may be shown in FIGS. 1 and 2, in which the size S2 of the orthographic projection of the first channel portion on the base substrate in the first direction is 0.5 microns, and the size L of the orthographic projection of the first doped portion on the base substrate in the first direction is 0.5 microns. As shown in FIG. 22, when the size S2 of the orthographic projection of the first channel portion in the second transistor on the base substrate in the first direction is 0.5 microns and the size L of the orthographic projection of the first doped portion on the base substrate in the first direction is 0.5 microns, the second transistor has smaller leakage current, and the second transistor corresponding to the curve 103 and the second transistor corresponding to the curve 101 has similar threshold voltage. Compared with the curve 101, the second transistor corresponding to the curve 103 may reduce the leakage current in turn-off stage by one order of magnitude.

This exemplary embodiment also provides a display device including the above-described display panel. The display device may be a display device such as a mobile phone or a tablet computer.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes may be made without departing from the scope thereof. It is intended that the scope of the invention only be limited by the appended claims.

What is claimed is:

1. A thin film transistor, comprising:
   a semiconductor material layer located at a side of a base substrate, wherein the semiconductor material layer comprises a first channel portion, a first doped portion and a second channel portion which are sequentially connected;
   a first insulating layer located at a side of the semiconductor material layer facing away from the base substrate;
   a gate layer located at a side of the first insulating layer facing away from the base substrate, the gate layer comprising:
      a first gate portion, an orthographic projection of the first gate portion on the base substrate covering an orthographic projection of the first channel portion on the base substrate, and the first gate portion being configured to receive a gate driving signal;
      a second gate portion, an orthographic projection of the second gate portion on the base substrate covering an orthographic projection of the second channel portion on the base substrate, and the second gate portion being suspended; wherein the semiconductor material layer further comprises: a second doped portion connected to the first channel portion; a third doped portion connected to the second channel portion; the thin film transistor further comprises: a second insulating layer located at a side of the gate layer facing away from the base substrate; wherein a first via hole penetrating through the first insulating layer and the second insulating layer and a second via hole penetrating through the first insulating layer and the second insulating layer are formed on the first insulating layer and the second insulating layer; an orthographic projection of the first via hole on the base substrate is on an orthographic projection of the second doped portion on the base substrate, and an orthographic projection of the second via hole on the base substrate is on an orthographic projection of the third doped portion on the base substrate; a source/drain layer located at a side of the second insulating layer facing away from the base substrate, the source/drain layer comprising: a first conductive portion connected to the second doped portion through the first via hole for forming a first electrode of the thin film transistor; a second conductive portion connected to the third doped portion through the second via hole for forming a second electrode of the thin film transistor.

2. The thin film transistor according to claim 1, wherein the orthographic projection of the first channel portion on the base substrate is rectangular, an orthographic projection of the first doped portion on the base substrate is rectangular, and the orthographic projection of the second channel portion on the base substrate is rectangular; and the orthographic projection of the first channel portion on the base substrate, the orthographic projection of the first doped portion on the base substrate and the orthographic projection of the second channel portion on the base substrate are sequentially distributed in a first direction.

3. The thin film transistor according to claim 1, wherein a size of the orthographic projection of the first channel portion on the base substrate in the first direction is S1, and a size of the orthographic projection of the second channel portion on the base substrate in the first direction is S2; and wherein a value of S1/S2 is 3-15.

4. The thin film transistor according to claim 3, wherein a size of the orthographic projection of the first doped portion on the base substrate in the first direction is L; and wherein a value of S1/L is 3-15.

5. The thin film transistor according to claim 4, wherein S1 is equal to 2.8-3.2 microns, S2 is equal to 0.2-0.8 microns, and L is equal to 0.2-0.8 microns.

6. The thin film transistor according to claim 1, wherein the semiconductor material layer is made of a polysilicon semiconductor.

7. The thin film transistor according to claim 1, wherein the semiconductor material layer further comprises:
a fourth doped portion connected between the first channel portion and the second doped portion;
a third channel portion connected between the second doped portion and the fourth doped portion;
the gate layer further comprises:
a third gate portion, an orthographic projection of the third gate portion on the base substrate covering an orthographic projection of the third channel portion on the base substrate, and the third gate portion being connected with the first gate portion.

8. The thin film transistor according to claim 1, wherein the semiconductor material layer further comprises:

a fourth doped portion connected between the second channel portion and the third doped portion;
a third channel portion connected between the third doped portion and the fourth doped portion;
the gate layer further comprises:
a third gate portion, an orthographic projection of the third gate portion on the base substrate covering an orthographic projection of the third channel portion on the base substrate, and the third gate portion being connected with the first gate portion.

9. A display panel comprising at least one thin film transistor according to claim 1.

10. The display panel according to claim 9, wherein the at least one thin film transistor comprises a first transistor, the display panel comprises a pixel driving circuit comprising a driving transistor and the first transistor, a first electrode of the first transistor is connected with a gate of the driving transistor, and the first transistor forms the thin film transistor.

11. The display panel according to claim 10, wherein a second electrode of the first transistor is connected to an initial signal terminal, the at least one thin film transistor further comprises a second transistor, the pixel driving circuit further comprises a second transistor, a second electrode of the second transistor is connected to a gate of the driving transistor, and the first electrode is connected to a first electrode of the driving transistor.

12. The display panel according to claim 11, wherein the display panel comprises:
a base substrate;
an active layer located at a side of the base substrate, the active layer comprising:
a first active portion for forming a first channel portion of the first transistor; and
a second active portion for forming a second channel portion of the first transistor, an orthographic projection of the first active portion on the base substrate and an orthographic projection of the second active portion on the base substrate being distributed in a fourth direction;
a first conductive layer located at a side of the active layer facing away from the base substrate, the first conductive layer comprising:
a first gate line, an orthographic projection of the first gate line on the base substrate extending in a third direction, and covering an orthographic projection of the first active portion on the base substrate, a part of the first gate line being configured to form a first gate of the first transistor, and the third direction intersecting with the fourth direction;
a third conductive portion, an orthographic projection of the third conductive portion on the base substrate covering the orthographic projection of the second active portion on the base substrate for forming a second gate of the first transistor;
a second conductive layer located at a side of the first conductive layer facing away from the base substrate, the second conductive layer comprising:
a second gate line for providing the initial signal terminal;
wherein an orthographic projection of the third conductive portion on the base substrate is at a side of the orthographic projection of the first gate line on the base substrate away from an orthographic projection of the second gate line on the base substrate.

13. The display panel according to claim 12, wherein the first transistor is the thin film transistor according to claim 8, and the active layer further comprises:
- a third active portion for forming a third channel portion of the first transistor;
- a fourth active portion for forming a fourth doped portion of the first transistor, an orthographic projection of the fourth active portion on the base substrate is at a side of the orthographic projection of the first gate line on the base substrate away from the orthographic projection of the third conductive portion on the base substrate;
- wherein the orthographic projection of the first gate line on the base substrate also covers the orthographic projection of the third active portion on the base substrate, and a part of the first gate line is configured to form a third gate of the first transistor;
- a second electrode of the driving transistor is connected with a first power terminal, and the display panel further comprises a third conductive layer located at a side of the second conductive layer facing away from the base substrate, and the third conductive layer comprises:
- a power line for providing the first power terminal, wherein an orthographic projection of the power line on the base substrate extends in the fourth direction, and the orthographic projection of the first active portion on the base substrate is at a side of the orthographic projection of the third active portion on the base substrate away from the orthographic projection of the power line on the base substrate.

14. The display panel according to claim 13, wherein the orthographic projection of the second gate line on the base substrate at least partially coincides with the orthographic projection of the fourth active portion on the base substrate.

15. The display panel according to claim 13, wherein the pixel driving circuit further comprises a capacitor, a first electrode of the capacitor is connected to the gate of the driving transistor, and a second electrode of the capacitor is connected to the first power terminal, and the active layer further comprises:
- a fifth active portion for forming a first channel portion of the second transistor;
- a sixth active portion for forming a second channel portion of the second transistor;
- the first conductive layer comprises:
- a third gate line, an orthographic projection of the third gate line on the base substrate extending in the third direction, and covering an orthographic projection of the fifth active portion on the base substrate, and a part of the third gate line being configured to form a first gate of the second transistor;
- a fourth conductive portion, an orthographic projection of the fourth conductive portion on the base substrate covering an orthographic projection of the sixth active portion on the base substrate for forming a second gate of the second transistor;
- a fifth conductive portion for forming the gate of the driving transistor and a first electrode of the capacitor;
- the second conductive layer further comprises:
- a sixth conductive portion, an orthographic projection of the sixth conductive portion on the base substrate at least partially overlapping with an orthographic projection of the fifth conductive portion on the base substrate for form a second electrode of the capacitor, and the orthographic projection of the sixth conductive portion on the base substrate being at a side of the orthographic projection of the third gate line on the base substrate away from the orthographic projection of the first gate line on the base substrate;
- wherein the orthographic projection of the fourth conductive portion on the base substrate is between the orthographic projection of the third gate line on the base substrate and the orthographic projection of the first gate line on the base substrate.

16. The display panel according to claim 15, wherein the third direction is a row direction, the display panel further comprises a first pixel driving circuit and a second pixel driving circuit which are adjacently arranged in the row direction, and the second conductive layer further comprises:
- a first connecting portion connected to the same power line as a driving transistor in the first pixel driving circuit;
- wherein an orthographic projection of the first connecting portion on the base substrate at least partially coincides with an orthographic projection of the first gate of the second transistor in the second pixel driving circuit on the base substrate.

17. The display panel according to claim 15, wherein the first gate line, the third gate line, the third conductive portion and the fourth conductive portion are formed on the same layer by optical proximity correction mask technology.

18. A display device comprising the display panel according to claim 9.

* * * * *